United States Patent
Zhang et al.

(10) Patent No.: US 10,162,273 B2
(45) Date of Patent: Dec. 25, 2018

(54) OVERLAY KEY, METHOD OF FORMING THE SAME, AND METHOD OF MEASURING OVERLAY ACCURACY

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Yuhu Zhang, Beijing (CN); Junmao Wang, Beijing (CN); Bin Nie, Beijing (CN); Hao Yue, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/527,910

(22) PCT Filed: May 3, 2016

(86) PCT No.: PCT/CN2016/080885
§ 371 (c)(1),
(2) Date: May 18, 2017

(87) PCT Pub. No.: WO2017/140034
PCT Pub. Date: Aug. 24, 2017

(65) Prior Publication Data
US 2018/0107126 A1    Apr. 19, 2018

(30) Foreign Application Priority Data

Feb. 15, 2016    (CN) .......................... 2016 1 0085710

(51) Int. Cl.
*G03F 7/20* (2006.01)
*G01B 11/14* (2006.01)

(52) U.S. Cl.
CPC .......... *G03F 7/70683* (2013.01); *G01B 11/14* (2013.01); *G03F 7/70633* (2013.01)

(58) Field of Classification Search
CPC .. G03F 7/70683; G03F 7/70633; G01B 11/14
See application file for complete search history.

(56) References Cited

U.S. PATENT DOCUMENTS 3,875,568 A * 4/1975 Bailey ................ G11C 19/0816
365/19
4,133,045 A * 1/1979 Littwin .............. G11C 19/0816
365/14

(Continued)

FOREIGN PATENT DOCUMENTS

| CN | 102314071 A | 1/2012 |
|----|-------------|--------|
| CN | 102543684 A | 7/2012 |

(Continued)

OTHER PUBLICATIONS

International Search Report and Written Opinion in PCT/CN2016/080885 dated Nov. 23, 2016, with English translation. 16 pages.

(Continued)

*Primary Examiner* — Gordon J Stock, Jr.
(74) *Attorney, Agent, or Firm* — Womble Bond Dickinson (US) LLP

(57) ABSTRACT

Embodiments of the present disclosure disclose an overlay key including at least two overlay marks each having a first sub-mark and a second sub-mark centro-symmetrical to each other, the first sub-mark and the second sub-mark each including two bar patterns that are perpendicular to each other and have a common end. At least two of the overlay marks are located in different layers. Also disclosed is a (Continued)

method of forming the overlay key and a method of measuring overlay accuracy.

17 Claims, 6 Drawing Sheets

(56) References Cited

U.S. PATENT DOCUMENTS

| | | | |
|---|---|---|---|
| 6,278,116 B1 | 8/2001 | Wu | |
| 6,350,548 B1* | 2/2002 | Leidy | G03F 7/70633 |
| | | | 257/797 |
| 8,513,822 B1 | 8/2013 | Ghinovker | |
| 8,781,211 B2* | 7/2014 | Ghinovker | G03F 7/70633 |
| | | | 382/141 |
| 9,123,649 B1* | 9/2015 | Manassen | G01B 11/14 |
| 2002/0102482 A1* | 8/2002 | Smith | G03F 7/70558 |
| | | | 430/22 |
| 2007/0058169 A1* | 3/2007 | Ausschnitt | G03F 7/70633 |
| | | | 356/401 |
| 2007/0222088 A1* | 9/2007 | Smith | G03F 9/7076 |
| | | | 257/797 |
| 2013/0157389 A1* | 6/2013 | Wang | G03F 7/70633 |
| | | | 438/14 |
| 2014/0055795 A1* | 2/2014 | Jiang | G03F 9/00 |
| | | | 356/614 |
| 2014/0264961 A1* | 9/2014 | Huang | G03F 7/70633 |
| | | | 257/797 |

FOREIGN PATENT DOCUMENTS

| | | |
|---|---|---|
| CN | 102809895 A | 12/2012 |
| CN | 103377963 A | 10/2013 |
| CN | 103713467 A | 4/2014 |
| CN | 104898383 A | 9/2015 |
| CN | 105511235 A | 4/2016 |
| JP | 2005175270 A | 6/2005 |
| KR | 20020046286 A * | 6/2002 |

OTHER PUBLICATIONS

Office Action in Chinese Application No. 201610085710.8 dated Mar. 28, 2017, with English translation. 13 pages.

* cited by examiner

OVERLAY KEY, METHOD OF FORMING THE SAME, AND METHOD OF MEASURING OVERLAY ACCURACY

CROSS-REFERENCE TO RELATED APPLICATIONS

The present application is the U.S. national phase entry of PCT/CN2016/080885, with an international filing date of May 3, 2016, which claims the benefit of Chinese Patent Application No. 201610085710.8, filed on Feb. 15, 2016.

TECHNICAL FIELD

The present disclosure relates to the field of photolithography, and particularly to an overlay key, a method of forming the overlay key, and a method of measuring overlay accuracy.

BACKGROUND

Photolithography is a process where a pattern in a mask is transferred to a substrate through alignment, exposure and development. In the case of multiple layers, it is of importance to ensure that the patterns of different layers are aligned with each other. An overlay deviation refers to a positional deviation between the patterns of different layers due to e.g. misalignment of the masks.

FIGS. 1A and 1B are plan views of overlay keys used in measuring overlay accuracy between different layers in the prior art. As shown in FIG. 1A, a plurality of marks 201 are formed in a first layer that are rectangular frames (by way of example, only three overlay marks $201_1$, $201_2$ and $201_3$ are shown). Then, as shown in FIG. 1B, in forming subsequent layers above the first layer, marks $202_1$, $202_2$ and $202_3$, which are shown as black blocks, are formed in turn in respective layers. Specifically, mark $202_1$ is formed in a second layer, mark $202_2$ is formed in a third layer, and mark $202_3$ is formed in a fourth layer. Marks $202_1$, $202_2$ and $202_3$ are located within the rectangular frames $201_1$, $201_2$ and $201_3$, respectively. When overlay accuracy is measured, the coordinates of the centers of the respective black blocks and the coordinates of the centers of the respective rectangular frames may be determined in a pre-established coordinate system. The overlay accuracy between the first layer and a layer to which a black block corresponds may be measured by calculating a difference between the coordinate of the center of the black block and the coordinate of the center of a corresponding rectangular frame.

A problem with such a prior art overlay key however is that 1) the plurality of rectangular frames occupy a relatively large area, wasting the space of the substrate, and that 2) the overlay accuracy between any two layers other than the first layer cannot be measured directly.

Thus, there is a need for an improved overlay key, a method of forming the overlay key, and a method of measuring overlay accuracy.

SUMMARY

It would be advantageous to provide an overlay key which may alleviate or mitigate the need of the overlay key for a large substrate area. The overlay key may further be used to measure the overlay accuracy between different layers (whether between the lowest layer and the highest layer, or between two different higher layers). It would also be desirable to provide a method of forming the overlay key and a method of measuring overlay accuracy.

According to a first aspect of the present disclosure, an overlay key is provided comprising at least two overlay marks each having a first sub-mark and a second sub-mark centro-symmetrical to each other. The first sub-mark and the second sub-mark each comprise two bar patterns that are perpendicular to each other and which have a common end, and at least two of the overlay marks are located in different layers.

In some embodiments, the first sub-marks of the overlay marks are successively arranged to form a first step-wise pattern and the second sub-marks of the overlay marks are successively arranged to form a second step-wise pattern.

In some embodiments, the first step-wise pattern and the second step-wise pattern do not overlap with each other.

In some embodiments, one of the at least two overlay marks is arranged such that the first sub-mark and the second sub-mark thereof are connected at a symmetry center for them.

In some embodiments, the first sub-marks of the at least two overlay marks are successively arranged in a first direction away from the symmetry center, and the second sub-marks of the at least two overlay marks are successively arranged in a second direction opposite to the first direction.

In some embodiments, the two bar patterns have the same length.

According to another aspect of the present disclosure, a display substrate is provided comprising the overlay key as described above. The overlay key may be located in a non-display area of the display substrate. Also provided is a display panel comprising the display substrate as described above.

According to another aspect of the present disclosure, a method of forming an overlay key is provided comprising forming at least two overlay marks each having a first sub-mark and a second sub-mark centro-symmetrical to each other. The first sub-mark and the second sub-mark each comprise two bar patterns that are perpendicular to each other and which have a common end, and at least two of the overlay marks are located in different layers.

In some embodiments, the first sub-marks of the overlay marks are successively arranged to form a first step-wise pattern and the second sub-marks of the overlay marks are successively arranged to form a second step-wise pattern.

In some embodiments, the first step-wise pattern and the second step-wise pattern do not overlap with each other.

In some embodiments, one of the at least two overlay marks is arranged such that the first sub-mark and the second sub-mark thereof are connected at a symmetry center for them.

In some embodiments, the first sub-marks of the at least two overlay marks are successively arranged in a first direction away from the symmetry center, and the second sub-marks of the at least two overlay marks are successively arranged in a second direction opposite to the first direction.

In some embodiments, the two bar patterns have the same length.

According to another aspect of the present disclosure, a method of measuring overlay accuracy is provided comprising acquiring an image of at least two overlay marks each having a first sub-mark and a second sub-mark centro-symmetrical to each other. The first sub-mark and the second sub-mark each comprise two bar patterns that are perpendicular to each other and which have a common end, and at least two of the overlay marks are located in different layers. The method further comprises measuring the overlay accuracy between the different layers based on positional information of the at least two overlay marks in the image.

In some embodiments, the measuring the overlay accuracy comprises: determining in the image a respective symmetry center for the first sub-mark and second sub-mark of each of two overlay marks located in the different layers; determining a positional deviation between the determined symmetry centers; and measuring the overlay accuracy between the different layers based on the positional deviation.

In some embodiments, the first sub-marks of the overlay marks are successively arranged to form a first step-wise pattern and the second sub-marks of the overlay marks are successively arranged to form a second step-wise pattern. The measuring the overlay accuracy comprises: determining that there is an overlay deviation between two layers where two adjacent first sub-marks in the first step-wise pattern or two adjacent second sub-marks in the second step-wise pattern are located respectively, based on an overlap between the two adjacent first sub-marks or the two adjacent second sub-marks in the image.

These and other aspects of the present disclosure will be apparent from and elucidated with reference to the embodiment(s) described hereinafter.

DETAILED DESCRIPTION

Figure 1A:
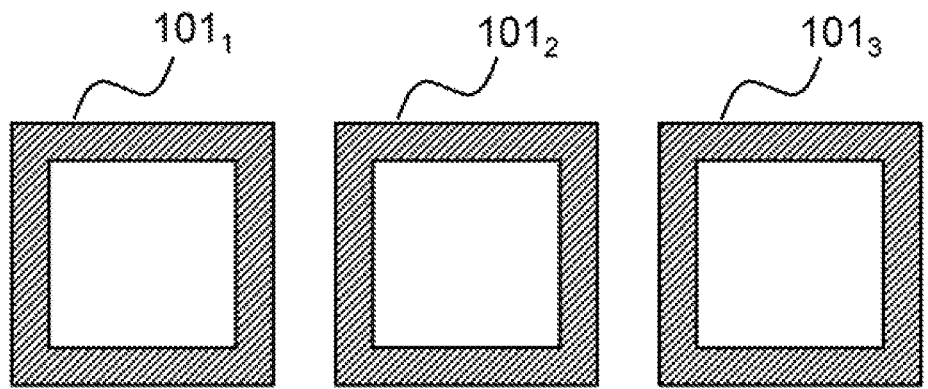
FIGS. 1A and 1B are plan views of overlay keys used in measuring overlay accuracy between different layers in the prior art.
Figure 1B:
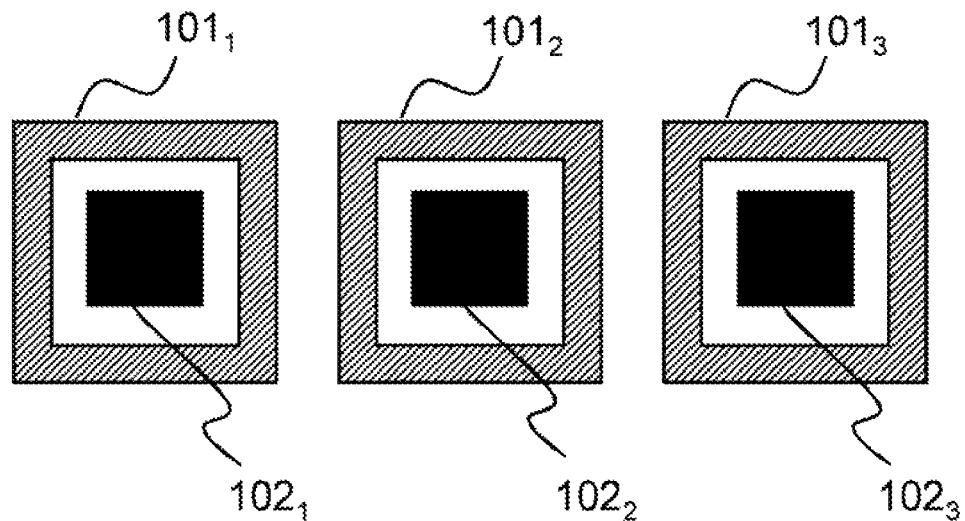

Embodiments of the present disclosure will be described in detail with reference to the accompanying drawings.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Embodiments of the disclosure are described herein with reference to schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of the disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overlay formal sense unless expressly so defined herein.

Figure 2:
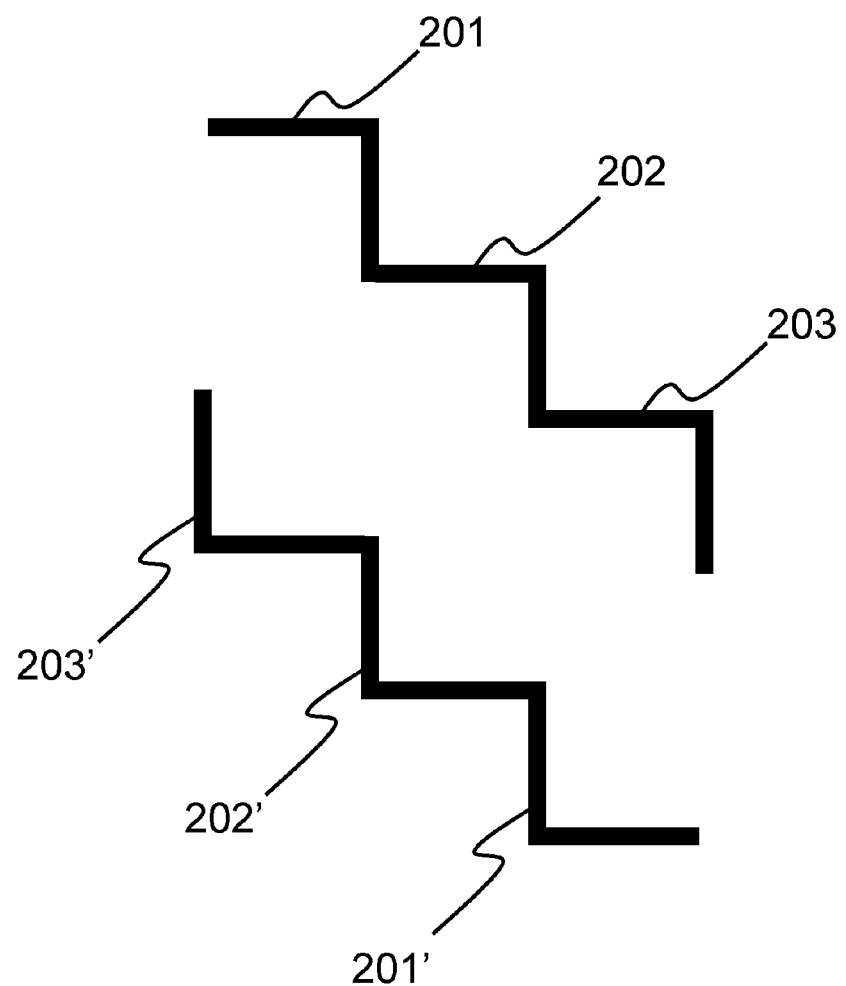
FIG. 2 is a plan view of an overlay key according to an embodiment of the present disclosure.

FIG. 2 is a plan view of an overlay key according to an embodiment of the present disclosure. The overlay key comprises at least two overlay marks. In the example shown in FIG. 2, the overlay key comprises a first overlay mark 201, 201', a second overlay mark 202, 202', and a third overlay mark 203, 203'. The first overlay mark 201, 201' has a first sub-mark 201 and a second sub-mark 201' centro-symmetrical to each other. The second overlay mark 202, 202' has a first sub-mark 202 and a second sub-mark 202' centro-symmetrical to each other. The third overlay mark 203, 203' has a first sub-mark 203 and a second sub-mark 203' centro-symmetrical to each other.

At least two of the overlay marks are located in different layers. In this example, the first overlay mark 201, 201' may be formed in a lower layer, and the second overlay mark 202, 202' and the third overlay mark 203, 203' may be formed in higher layers above the lower layer. Specifically, the first overlay mark 201, 201' may be formed in a first layer on a substrate, the second overlay mark 202, 202' may be formed in a second layer above the first layer, and the third overlay mark 203, 203' may be formed in a third layer above the second layer. However, other embodiments are possible. For example, the second overlay mark 202, 202' and the third overlay mark 203, 203' may be formed in the same layer.

As illustrated, the first sub-marks 201, 202, 203 and the second sub-marks 201', 202', 203' each comprise two bar patterns that are perpendicular to each other. The two bar patterns have a common end. In some embodiments, when viewed from above, the first sub-marks 201, 202, 203 may be successively arranged to form a first step-wise pattern, and the second sub-marks 201', 202', 203' may be successively arranged to form a second step-wise pattern. In other embodiments, the first sub-marks and the second sub-marks may be arranged to form other patterns.

The overlay key shown in FIG. 2 may be regarded as formed in the condition that the first layer, the second layer and the third layer are aligned precisely. In this case, the first sub-marks 201, 202, 203 in the first step-wise pattern are connected end-to-end to form a successive pattern. Likewise, the second sub-marks 201', 202', 203' in the second step-wise pattern are connected end-to-end to form a successive pattern.

Figure 3:
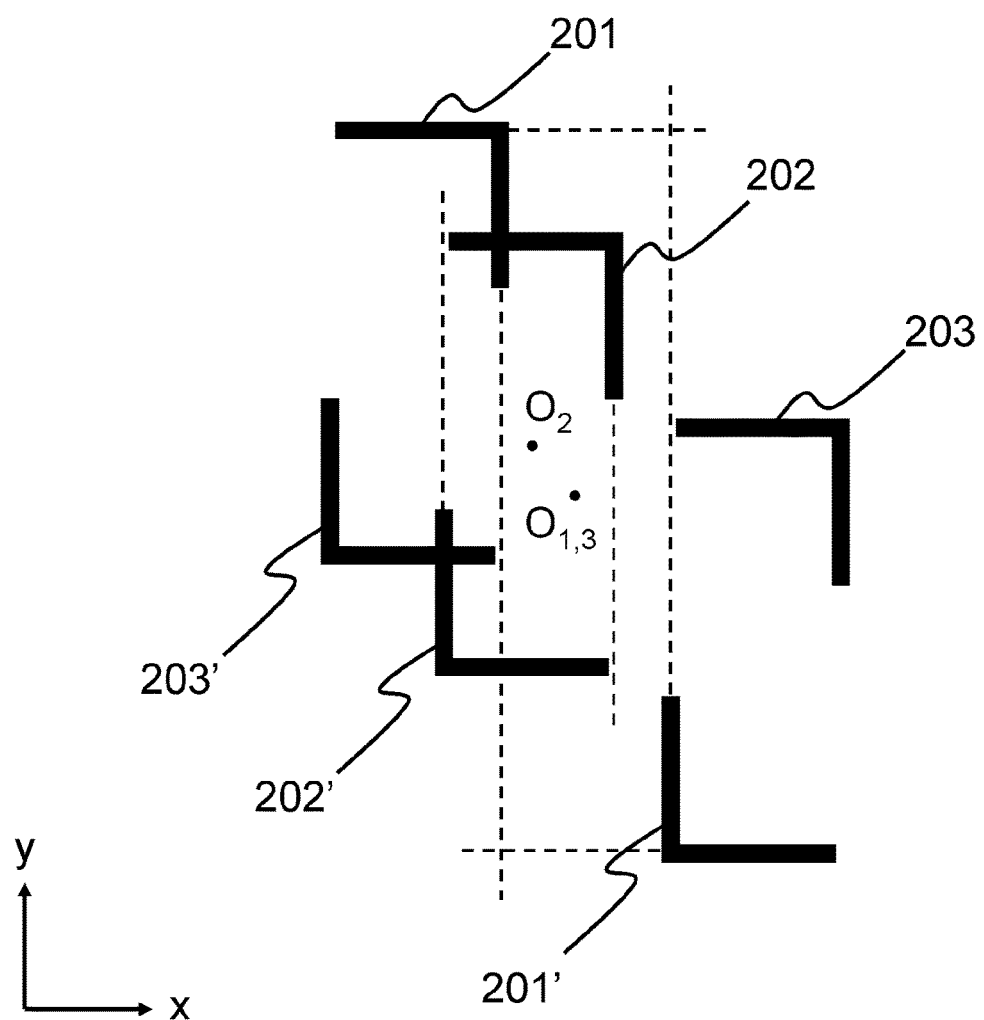
FIG. 3 is a plan view of the overlay key shown in FIG. 2 wherein an overlay mark deviates in the x-direction and the y-direction.

FIG. 3 is a plan view of the overlay key shown in FIG. 2 wherein an overlay mark deviates in the x-direction and the y-direction. In this figure, the second overlay mark 202, 202' deviates in the x-direction and the y-direction, whereas the first overlay mark 201, 201' and the third overlay mark 203, 203' remain at the same position as in FIG. 2. It is to be noted that the coordinate system in FIG. 3 is shown for ease of description of the deviation direction, rather than required by the embodiments in accordance with the present disclosure (discussed later).

In this example, the deviated first sub-mark 202 (corresponding to the second layer) overlaps in part with the adjacent first sub-mark 201 (corresponding to the first layer), and is disconnected to the other adjacent first sub-mark 203 (corresponding to the third layer). Similarly, the deviated second sub-mark 202' (corresponding to the second layer) overlaps in part with the adjacent second sub-mark 203' (corresponding to the third layer), and is disconnected to the other adjacent second sub-mark 201' (corresponding to the first layer). As compared with the successive step-wise pattern shown in FIG. 2, the overlap and disconnection in the step-wise pattern shown in FIG. 3 are easily observable. Therefore, it can be determined qualitatively as to whether there is an overlay deviation between different layers by judging whether there is an overlap (or disconnection) in the step-wise pattern. This may be performed prior to quantitative measurement of the overlay accuracy.

To this end, advantageously, the first step-wise pattern formed by the first sub-marks does not overlap the second step-wise pattern formed by the second sub-marks. In this case, the overlap between adjacent first sub-marks or adjacent second sub-marks would not be interfered by an overlap otherwise created between the first and second step-wise pattern, and thus can be observed more easily. This may improve the reliability of the qualitative judgment.

In addition, the two bar patterns of each of the first sub-marks and second sub-marks may have the same length. This may provide the same overlap discernibility in the x-direction and the y-direction. Of course, other embodiments are possible. For example, the two bar patterns may have different lengths, or the bar patterns of different sub-marks may have different lengths.

In the case of quantitative measurement, the overlay accuracy between different layers may be measured based on positional information of the first overlay mark 201, 201', the second overlay mark 202, 202', and the third overlay mark 203, 203'. Specifically, a respective symmetry center may be determined for the first sub-mark and second sub-mark of each of two overlay marks located in the different layers, and then the overlay accuracy between the different layers may be measured based on a positional deviation between the determined two symmetry centers.

In the example shown in FIG. 2, the first layer, the second layer and the third layer are precisely aligned such that the symmetry center $O_1$ of the first overlay mark 201, 201', the symmetry center $O_2$ of the second overlay mark 202, 202', and the symmetry center $O_3$ of the third overlay mark 203, 203' coincide with each other ($O_1$, $O_2$ and $O_3$ are not shown). In the example shown in FIG. 3, the symmetry center $O_1$ of the first overlay mark 201, 201' and the symmetry center $O_3$ of the third overlay mark 203, 203' remain unchanged in position (shown as $O_{1,3}$), whereas the symmetry center $O_2$ of the second overlay mark 202, 202' deviates. As described above, the overlay accuracy between the first layer and the second layer may be measured by determining the deviation between the symmetry center $O_1$ and the symmetry center $O_2$, and the overlay accuracy between the second layer and the third layer may be measured by determining the deviation between the symmetry center $O_2$ and the symmetry center $O_3$.

In an example, the symmetry center for the paired first sub-mark and second sub-mark may be determined by e.g. extending respective two bar patterns of the paired first sub-mark and second sub-mark with imagined lines (as indicated by the dashed lines in FIG. 3) such that the imagined lines together with the bar patterns form a rectangle, and determining the center of the rectangle as the symmetry center. Of course, other approaches may be utilized in other embodiments.

Figure 4:
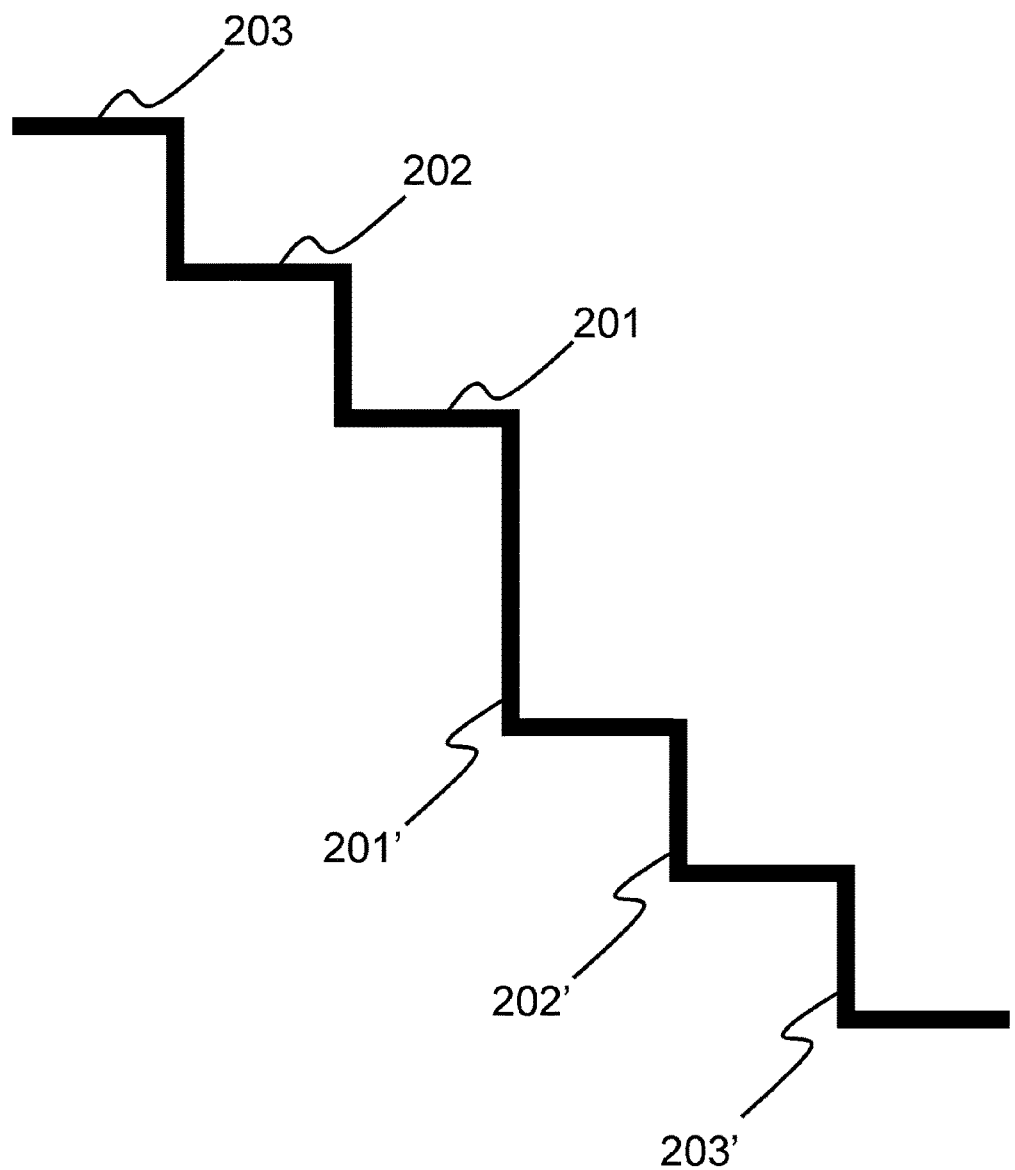
FIG. 4 is a plan view of a variation of an overlay key according to an embodiment of the present disclosure.

FIG. 4 is a plan view of a variation of an overlay key according to an embodiment of the present disclosure. As shown in FIG. 4, the first overlay mark 201, 201' is arranged such that the first sub-mark 201 and the second sub-mark 201' are connected at their symmetry center. This way, the distance between the first sub-mark 201 and the second sub-mark 201' is minimized (to zero). This may potentially reduce the footprint of the overlay key.

Further, in this example, the first sub-marks 201, 202, 203 are successively arranged in a first direction away from the symmetry center. The first direction may, for example, be a lateral direction or a longitudinal direction of the substrate. The second sub-marks 201', 202', 203' are successively arranged in a second direction opposite to the first direction. This allows all the first sub-marks and second sub-marks to be distributed substantially along one track such that the overlap between adjacent sub-marks becomes more easily recognizable in the case of an overlay deviation. Thus, such an arrangement trades off between a reduced substrate footprint and enhanced overlay deviation discernibility.

It is to be noted that the step-wise pattern as described herein may refer to a pattern formed by successively arranging two or more sub-marks through translation or rotation, each of the sub-marks comprising two bar patterns that are perpendicular to each other and have a common end. In some embodiments, ideally (e.g., when the layers are aligned precisely), the sub-marks are connected end-to-end to form a successive pattern, with the bar patterns immediately adjacent being perpendicular to each other. Thus, although three different step-wise patterns are shown in FIGS. 2-4, the present disclosure is not limited thereto. Other step-wise patterns are possible in other embodiments.

Figure 5:
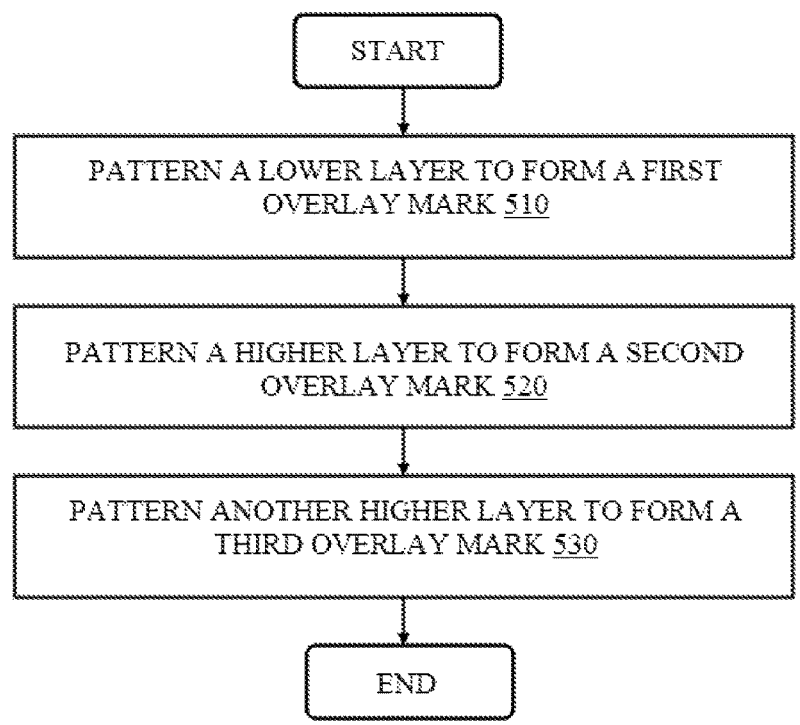
FIG. 5 is a flow chart of a method of forming an overlay key according to an embodiment of the present disclosure.

FIG. 5 is a flow chart of a method of forming an overlay key according to an embodiment of the present disclosure. As step 510, a lower layer is patterned to form a first overlay mark. An instance of the first overlay mark is the first overlay mark 201, 201' as described above. In an example, the lower layer may be formed on the substrate. I.e., the lower layer is the very first layer on the substrate. However, the present disclosure is not so limited. In other example, the lower layer may be an intermediate layer arranged between two layers. At step 520, a higher layer above the lower layer is patterned to form a second overlay mark. An instance of the second overlay mark is the second overlay mark 202, 202' as described above. At step 530, another higher layer is patterned to form a third overlay mark. An instance of the third overlay mark is the third overlay mark 203, 203' as described above.

Figure 6:
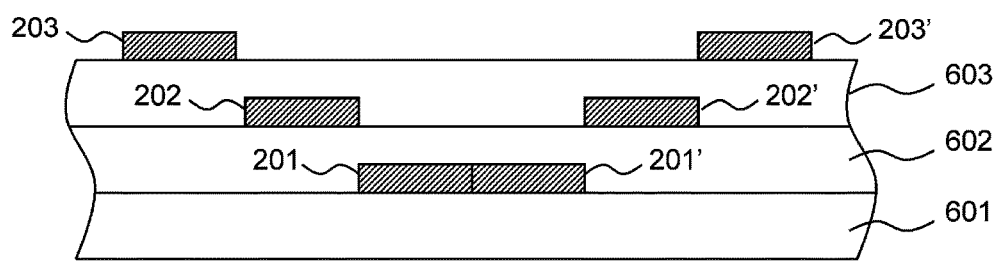
FIG. 6 is a cross-sectional view of an overlay key according to an embodiment of the present disclosure.

FIG. 6 is a cross-sectional view of an overlay key according to an embodiment of the present disclosure. As shown in FIG. 6, a first layer that is a lower layer is formed on a substrate 601. The first layer is patterned to form a first overlay mark 201, 201'. The first layer is applied with an intermediate insulator layer 602. A second layer that is a higher layer is formed on the intermediate insulator layer 602. The second layer is patterned to form the second overlay mark 202, 202'. The second layer is applied with an intermediate insulator layer 603. A third layer that is another higher layer is formed on the intermediate insulator layer 603. The third layer is patterned to form another third overlay mark 203, 203'. In this example, the first overlay mark 201, 201', the second overlay mark 202, 202' and the third overlay mark 203, 203' are arranged in different layers in the pattern as shown in FIG. 4. It is to be noted that the "lower layer" and the "higher layer" as used herein may refer to functional layers where functional elements such as a circuit pattern may be patterned in addition to the overlay key.

Figure 7:
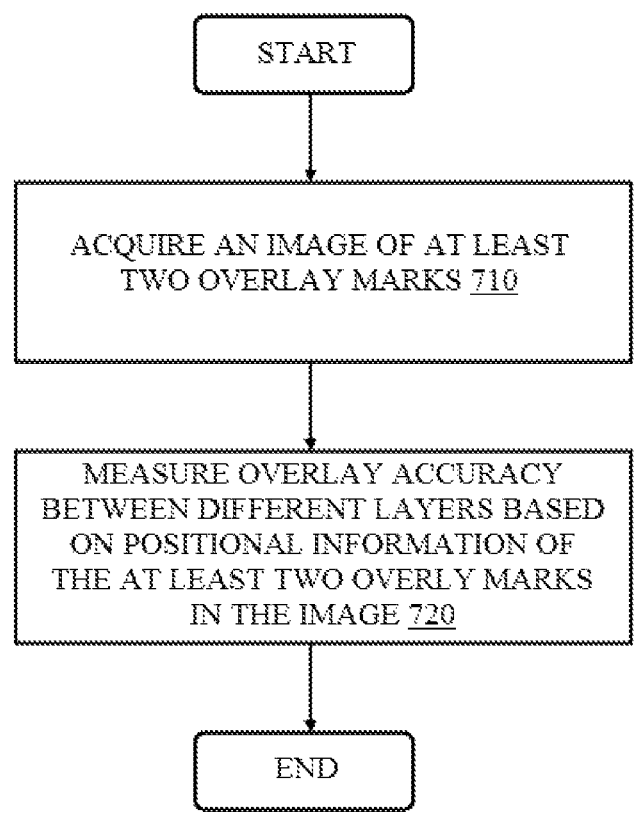
FIG. 7 is a flow chart of a method of measuring overlay accuracy according to an embodiment of the present disclosure.

FIG. 7 is a flow chart of a method of measuring overlay accuracy according to an embodiment of the present disclosure. At step 710, an image of at least two overlay marks is acquired. In this embodiment, at least two of the overlay marks are located in different layers. Instances of the overlay marks may be the first overlay mark 201, 201', the second overlay mark 202, 202' and the third overlay mark 203, 203' as described above. The image of the overlay key may be acquired by a measuring instrument (such as an optical microscope). The image can be provided for analysis. At step 720, the overlay accuracy between the different layers is measured based on positional information of the at least two overlay marks in the image.

Referring back to FIG. 3, in one example, the symmetry center $O_2$ for the first sub-mark 202 and second sub-mark 202' of the second overlay mark and the symmetry center $O_3$ for the first sub-mark 203 and second sub-mark 203' of the third overlay mark may be determined in the image. Determination of the symmetry centers may be performed using the approach as described above with respect to FIG. 3. Then, a positional deviation between the two symmetry centers $O_2$ and $O_3$ is determined. The overlay accuracy between the second layer and third layer can be measured based on the positional deviation.

In addition, the symmetry center $O_1$ for the first sub-mark 201 and second sub-mark 201' of the first overlay mark and the symmetry center $O_2$ for the first sub-mark 202 and second sub-mark 202' of the second overlay mark may be determined in the image. Determination of the symmetry centers may be performed using the approach as described above with respect to FIG. 3. Then, a positional deviation between the two symmetry centers $O_1$ and $O_2$ is determined. The overlay accuracy between the first layer and second layer can be measured based on the positional deviation.

It is to be noted that in the above measurement what is required is the positional deviation between the two symmetry centers (i.e., relative positional information), rather than absolute positional information (e.g., coordinates). That is, a pre-established coordinate system may not be needed in the embodiments of the present disclosure. This may avoid issues resulting from introduction of the coordinate system, for example, the measurement being prone to influence by the precision of the photolithography equipment itself.

Continuing with the example of FIG. 3, qualitative judgment of the overlay accuracy may also be achieved. Specifically, it can be determined that there is an overlay deviation between the first layer and second layer to which the first sub-marks 201 and 202 correspond (or the third layer and second layer to which the second sub-marks 203' and 202' correspond) based on an overlap between the two adjacent first sub-marks 201 and 202 in the first step-wise pattern (or the two adjacent second sub-marks 203' and 202' in the second step-wise pattern) in the image. It is to be understood that the disconnection between adjacent first sub-marks or adjacent second sub-marks may also be used for qualitative judgment of the overlay accuracy.

Advantageously, embodiments of the present disclosure enable measurement of the overlay accuracy between a current layer and any other layer using an overlay key having a reduced footprint. In some embodiments, it can be determined whether there is an overlay deviation prior to the quantitative measurement. Furthermore, as compared with the scheme where an overlay key having scale marks is used, the overlay key according to the embodiments of the present disclosure is less influenced by the precision of the photolithography equipment because it is not required to fabricate the scale marks in the overlay key.

In addition, by way of example, and not limitation, the substrate as described herein may refer to a display substrate. I.e., the overlay key described in the above embodiments may be formed in the display substrate for monitoring the fabrication process of the display substrate. In some embodiments, the overlay key may be located in a non-display area of the display substrate. Further, the display substrate may be assembled into a display panel. The display panel may be any product or component having display functionality such as electronic paper, a cell phone, a tablet, a television, a monitor, a laptop, a digital photo-frame or a navigator.

While several specific implementation details are contained in the above discussions, these should not be construed as limitations on the scope of any disclosure or of what may be claimed, but rather as descriptions of features that may be specific to particular embodiments of particular disclosures. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations are to be performed in the particular order shown or in a sequential order, or that all illustrated operations are to be performed to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Therefore, it is to be understood that the embodiments of the disclosure are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. An overlay key comprising:
   at least two overlay marks each having a first sub-mark and a second sub-mark centro-symmetrical to each other, the first sub-mark and the second sub-mark each comprising two bar patterns that are perpendicular to each other and have a common end,
   wherein at least two of the overlay marks are located in different layers, and
   wherein the first sub-marks of the overlay marks are successively arranged to form a first step-wise pattern and the second sub-marks of the overlay marks are successively arranged to form a second step-wise pattern.

2. The overlay key of claim 1, wherein the two bar patterns have the same length.

3. The overlay key of claim 1, wherein the first step-wise pattern and the second step-wise pattern do not overlap with each other.

4. A display substrate comprising the overlay key as recited in claim 3.

5. The overlay key of claim 1, wherein one of the at least two overlay marks is arranged such that the first sub-mark and the second sub-mark thereof are connected at a symmetry center for the first sub-mark and the second sub-mark.

6. The overlay key of claim 5, wherein the first sub-marks of the at least two overlay marks are successively arranged in a first direction away from the symmetry center, and wherein the second sub-marks of the at least two overlay marks are successively arranged in a second direction opposite to the first direction.

7. A display substrate comprising the overlay key as recited in claim 1.

8. The display substrate of claim 7, wherein the overlay key is located in a non-display area of the display substrate.

9. A display panel comprising the display substrate as recited in claim 7.

10. A method of forming an overlay key, comprising:
    forming at least two overlay marks each having a first sub-mark and a second sub-mark centro-symmetrical to each other, wherein the first sub-mark and the second sub-mark each comprise two bar patterns that are perpendicular to each other and which have a common end, wherein at least two of the overlay marks are located in different layers, and wherein the first sub-marks of the overlay marks are successively arranged to form a first step-wise pattern and the second sub-marks of the overlay marks are successively arranged to form a second step-wise pattern.

11. The method of claim 10, wherein the first step-wise pattern and the second step-wise pattern do not overlap with each other.

12. The method of claim 10, wherein the two bar patterns have the same length.

13. The method of claim 10, wherein one of the at least two overlay marks is arranged such that the first sub-mark and the second sub-mark thereof are connected at a symmetry center for the first sub-mark and the second sub-mark.

14. The method of claim 13, wherein the first sub-marks of the at least two overlay marks are successively arranged in a first direction away from the symmetry center, and wherein the second sub-marks of the at least two overlay marks are successively arranged in a second direction opposite to the first direction.

15. A method of measuring overlay accuracy, comprising:
    acquiring an image of at least two overlay marks each having a first sub-mark and a second sub-mark centro-symmetrical to each other, wherein the first sub-mark and the second sub-mark each comprise two bar patterns that are perpendicular to each other and which have a common end, wherein at least two of the overlay marks are located in different layers, and wherein the first sub-marks of the overlay marks are successively arranged to form a first step-wise pattern and the second sub-marks of the overlay marks are successively arranged to form a second step-wise pattern; and
    measuring the overlay accuracy between the different layers based on positional information of the at least two overlay marks in the image.

16. The method of claim 15, wherein the measuring the overlay accuracy comprises:
    determining in the image a respective symmetry center for the first sub-mark and second sub-mark of each of two overlay marks located in the different layers;
    determining a positional deviation between the determined symmetry centers; and
    measuring the overlay accuracy between the different layers based on the positional deviation.

17. The method of claim 15, wherein the measuring the overlay accuracy comprises:
    determining that there is an overlay deviation between two layers where two adjacent first sub-marks in the first step-wise pattern or two adjacent second sub-marks in the second step-wise pattern are located respectively, based on an overlap between the two adjacent first sub-marks or the two adjacent second sub-marks in the image.

* * * * *